(12) United States Patent
Chang et al.

(10) Patent No.: US 6,399,959 B1
(45) Date of Patent: Jun. 4, 2002

(54) THIN FILM TRANSISTOR WITH REDUCED METAL IMPURITIES

(75) Inventors: Ting-Chang Chang, Hsin-Chu; Ching-Wei Chen, Taipei, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/799,048

(22) Filed: Mar. 6, 2001

(51) Int. Cl.⁷ .............................................. H01L 29/04
(52) U.S. Cl. ........................ 257/57; 257/610; 438/622; 148/33.2
(58) Field of Search ................. 257/610, 617, 257/913, 611, 612, 131, 347, 352, 57

(56) References Cited

U.S. PATENT DOCUMENTS 5,757,063 A * 5/1998 Tomita et al. ............. 257/610
6,083,324 A * 7/2000 Henley et al. ............. 148/33.2
6,090,699 A * 7/2000 Aoyama et al. ............ 438/622

* cited by examiner

Primary Examiner—David Nelms
Assistant Examiner—Mai-Huong Tran

(57) ABSTRACT

A structure for forming thin film transistor with reduced metal impurities. The structure at least includes the following steps. First of all, an insulation substrate. Then, an insulating gettering layer on the insulation substrate, wherein the amorphous silicon layer defines an active area, and a channel region on the insulating gettering layer, a source region on the insulating gettering layer adjacent to the channel region, a drain region on the insulating gettering layer adjacent to the channel region and opposite to the source region, and a gate on the channel region, wherein the source, drain, insulating gettering layer and channel region are components of a transistor.

16 Claims, 4 Drawing Sheets

THIN FILM TRANSISTOR WITH REDUCED METAL IMPURITIES

BACKGROUND OF THE INVENTION

1. Field of the Invention

The present invention generally relates to a structure for manufacturing a metal-induced-laterally-crystallization thin-film transistor, and more particularly to a structure for using insulating gettering layer to reduced metal impurities under the channel region.

2. Description of the Prior Art

A method of crystallizing amorphous silicon using heat treatment at a low temperature after a certain kind of a metal layer has been deposited on the amorphous silicon is know as an MIC and MILC process. The MIC and MILC process is beneficial due to the low temperature crystallization of amorphous silicon. However, the MIC and MILC process has not been applied to electronic devices because of an inflow of metal impurity into the thin film of crystallized polycrystalline silicon formed underneath the metal layer, which cause the electrical characteristics of thin film transistor to deteriorate.

FIGS. 1A to 1C show a method of fabricating a channel region of a thin film transistor using an MILC process according to a related art.

Referring to FIG. 1A, an amorphous silicon layer 110, as an active layer is deposited on an insulation substrate 100 having a buffer film (not shown in FIG.) on its upper part, and the active layer 110 is patterned by photolithography and etching process. A gate insulation layer 120 and a gate electrode 130 are formed on the active layer by conventional processes.

Referring to FIG. 1B, a nickel layer 140 is formed to a thickness of 10~50 angstrom by sputtering nickel on the entire surface of the formed structure. Then a source region 110S and a drain 110D are formed at portions of the active layer by heavily doping the entire surface of the formed structure with impurities. Between the source region 110S and drain region 110D, a channel region 110C are formed on the substrate 100.

Referring to FIG. 1C, amorphous silicon in the active layer is crystallized by heating the substrate 100 at a temperature of 350° C.–600° C. Then the source region 110S and drain region 110D on which the nickel layer 140 has been formed become the MIC regions having amorphous silicon crystallized to be polycrystalline silicon by an MIC process. The channel region 110C without the nickel layer 140 formed directly thereon, becomes the MILC region where silicon has been crystallized to polycrystalline silicon by an MILC process. Dopants are activated in the source region 110S and drain regions 110D during the heat treatment as amorphous silicon is crystallized in the active layer.

In the thin film transistor fabricated by the above-described method according to the conventional art, the channel region 110C has boundaries defined by the polycrystalline structure of silicon in the MIC regions facing that of silicon in the adjacent MILC region. Since the boundary between the MIC region and the MILC region is located at the junction where the source or drain region meets the channel region, an abrupt difference in the crystal structure appears in the junction and the metal from the MIC region contaminates the adjacent MILC region. Consequently, traps are formed at such junctions which cause unstable channel regions and deteriorates the characteristics of the thin film transistor.

The main defect in the conventional method of TFT i.e. metal impurity pollution, causes diffusion in the channel region in the metal crystallization process so that a leakage current is enhance more and more which its own term damages the performance as well as the reliability of the device. Accordingly, there exists a need to provide a way to solve the metal impurity pollution issue for forming an insulating gettering layer with impurity gettering function under the channel region.

SUMMARY OF THE INVENTION

In accordance with the present invention, a method is provided for forming a TFT with insulating gettering layer that substantially can be used to solve metal impurity pollution issue in conventional process.

One of the objectives of the present invention is to provide a method to form an insulating gettering layer with impurity gettering function under the channel region.

Another of the objective of the present invention is to provide a method to form an insulating gettering layer with impurity gettering absorbing metal impurity within channel region and reducing the concentration of the metal impurity of channel region.

A further objective of the present invention is to provide a method to form an insulating gettering layer with impurity gettering keeping the temperature low, polycrystalline silicon big and to maintain a high carrier mobility in metal-induced-laterally-crystallization thin-film.

A further another objective of the present invention is to provide a method to form an insulating gettering layer with impurity gettering reducing leakage current to improve device performance and reliability.

In order to achieve the above objects, the present invention provides a structure for forming thin film transistor with reduced metal impurities. The structure at least includes the following steps. First of all, an insulation substrate. Then, an insulating gettering layer on the insulation substrate, wherein the amorphous silicon layer defines an active area, and a channel region on the insulating gettering layer, a source region on the insulating gettering layer adjacent to the channel region, a drain region on the insulating gettering layer adjacent to the channel region and opposite to the source region, and a gate on the channel region, wherein the source, drain, insulating gettering layer and channel region are components of a transistor.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

Some embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

FIG. 2A to FIG. 2E are cross-sectional views of a method for forming a TFT with insulating gettering layer with impurity gettering function under the channel region in accordance with one embodiment of the present invention.

Figure 1A:
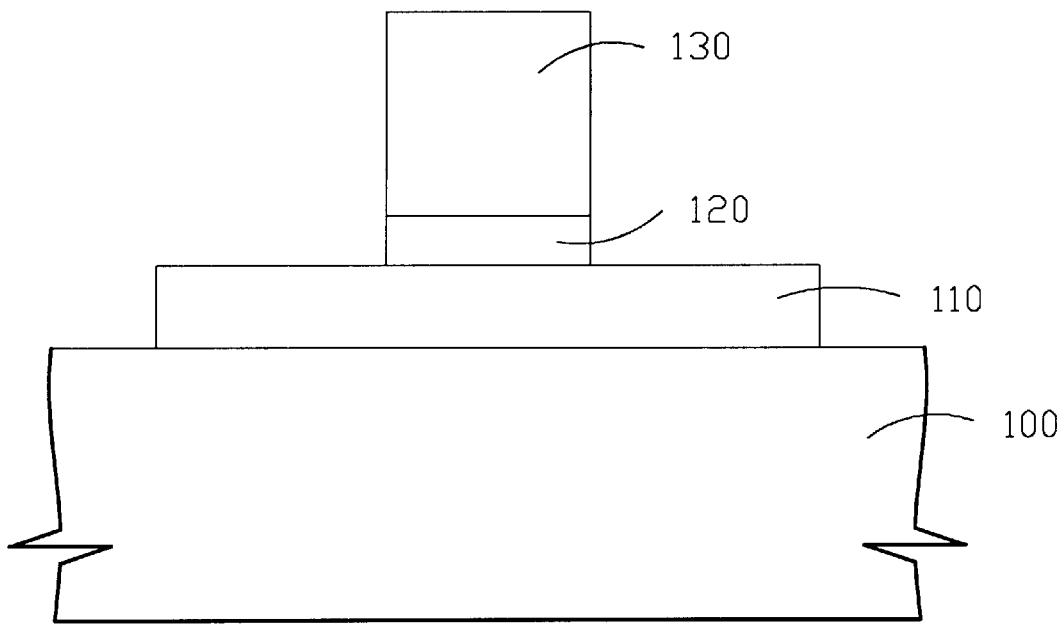
FIGS. 1A to 1C show a method of fabricating a channel region of a thin film transistor using an MILC process according to a prior art.
Figure 1B:
Figure 1B:
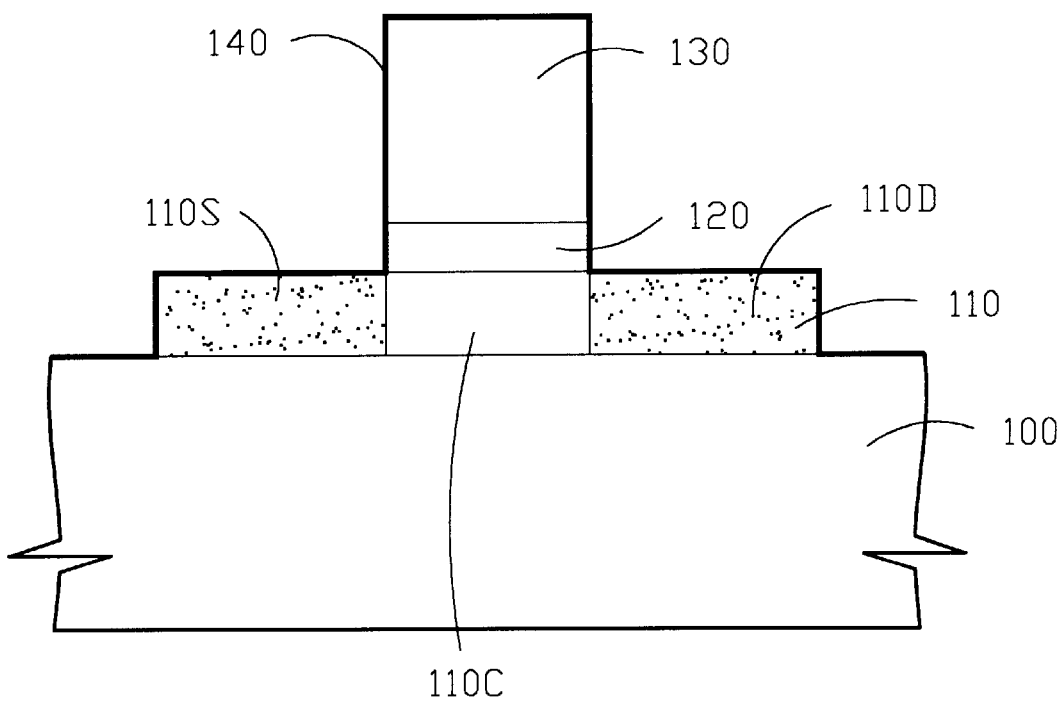
Figure 1C:
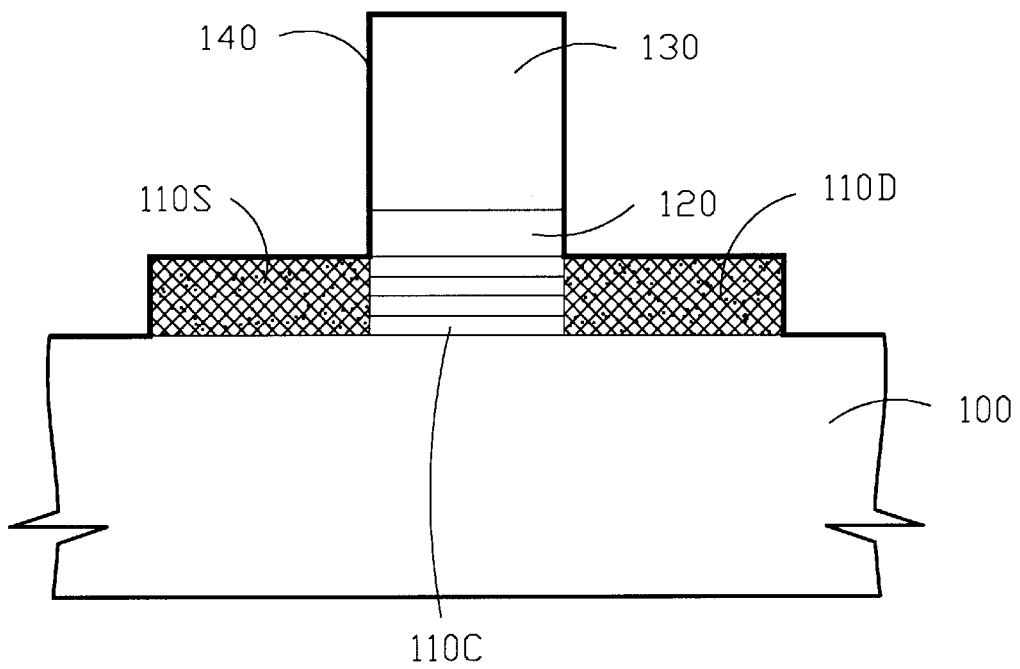
Figure 2A:
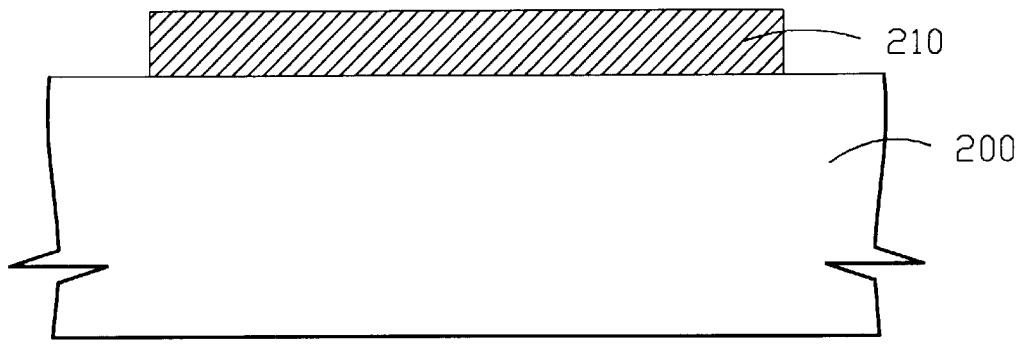
FIG. 2A to FIG. 2E are cross-sectional views of a method for forming a insulating gettering layer with impurity gettering function under the channel region in accordance with one preferred embodiment of the present invention.

Referring to FIG. 2A, an insulation substrate 200 is provided which that comprises glass substrate. First of all, as a key step in this invention, an insulating gettering layer 210 is formed with a thickness about 300~1000 angstroms on the insulation substrate 200. The insulating gettering layer 210 with impurity gettering absorbing metal impurity within channel layer and reducing the concentration of the metal impurity of channel layer. The insulating gettering layer can be a phosphosilicate glass (PSG) layer formed by chemical vapor deposition, e.g. plasma enhanced CVD, APCVD and LPCVD, preferably plasma enhanced CVD at a temperature between 300° C. and 350° C.

Figure 2B:
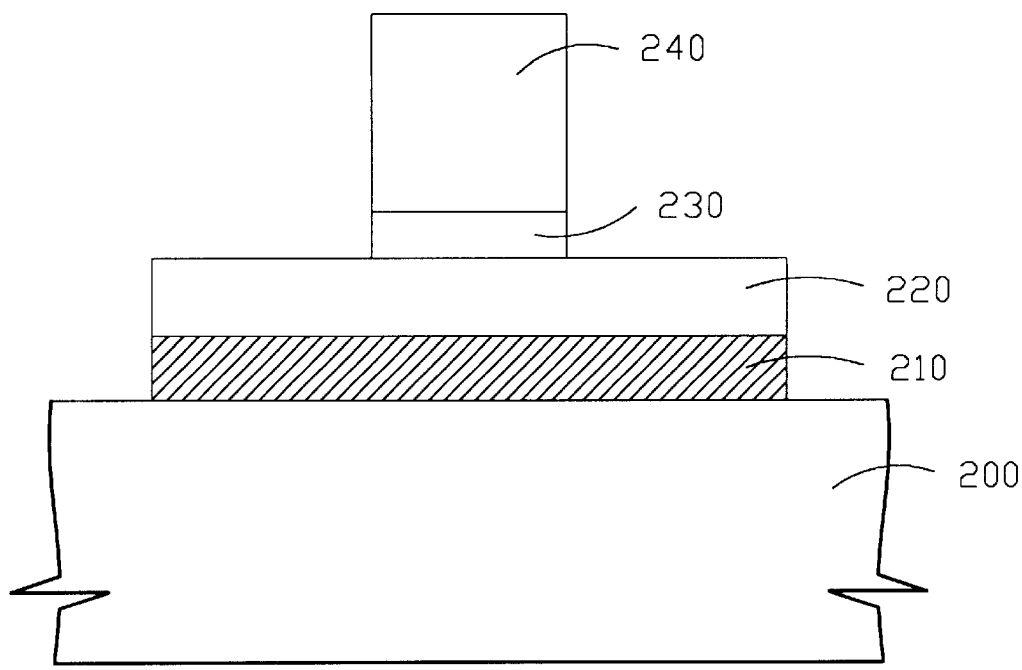

Referring to FIG. 2B, an amorphous silicon layer as an active region 220 is formed on an insulating gettering layer 210 having a buffer film (not shown in FIG.) thereon. The active region 220 is deposited by LPCVD (Low Pressure Chemical Vapor Deposition) with a thickness of about 1000 Å and patterned by photolithography. Then, an insulating layers such as a gate insulating layer 230, is formed to a thickness of 1000 Å to 15000 Å by PECVD, the dielectric layer 230 can be a $SiO_2$ layer, deposited by atmospheric pressure CVD method, utilizing $SiH_4$ as reaction gas, under the pressure of 0.5~1 torr, at temperature between 400° C. and 500° C. Alternatively, deposited by plasma enhanced CVD method, utilizing $SiH_4$ as reaction gas, under the pressure of 1~10 torr, at temperature of 300~400° C. Otherwise, deposited by plasma enhanced CVD method, utilizing TEOS/O3 as reaction gas. Then, a polysilicon layer for forming a gate electrode 240 is deposited on the dielectric layer 230 to a thickness of about 2000~3000 Å by sputtering. The polysilicon layer is patterned by using photolithography to form the gate insulating layer 230. The gate electrode 240 is patterned by using photolithography to form the dielectric layer 230. The gate electrode 240 is used as an etch mask to etch the dielectric layer 230.

Figure 2C:
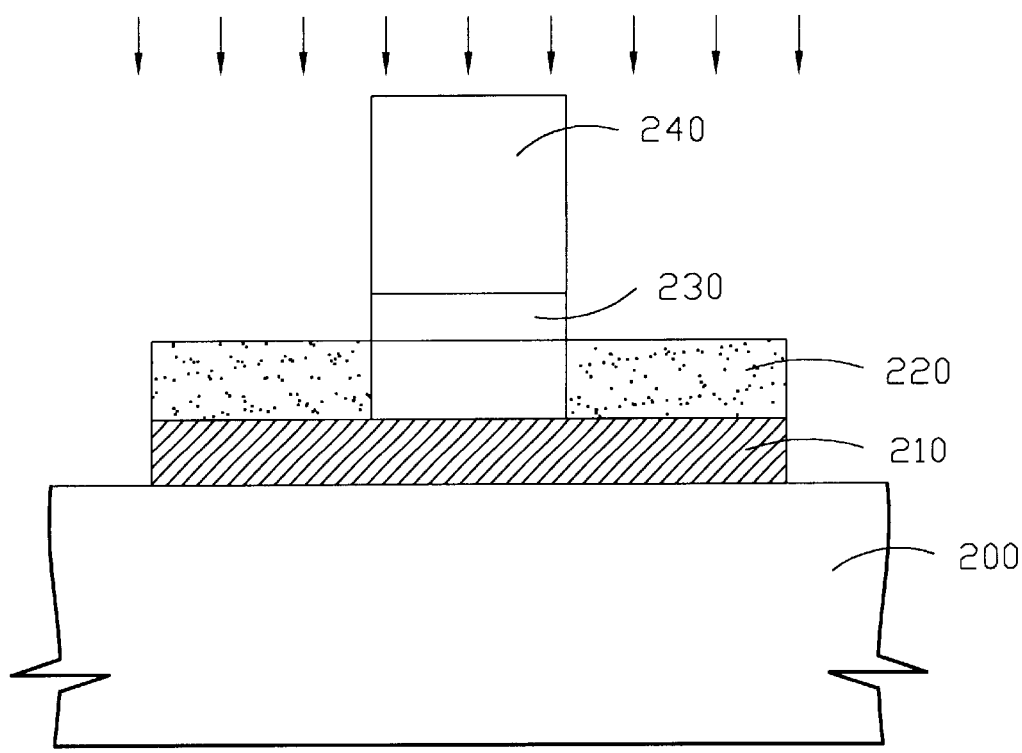

Referring to FIG. 2C, source region 220S and drain region 220D are formed in portions of the active layer 220 by doping heavily the entire surface of the formed structure, wherein the dielectric layer 230 and the gate electrode 240 function as a doping mask.

Figure 2D:
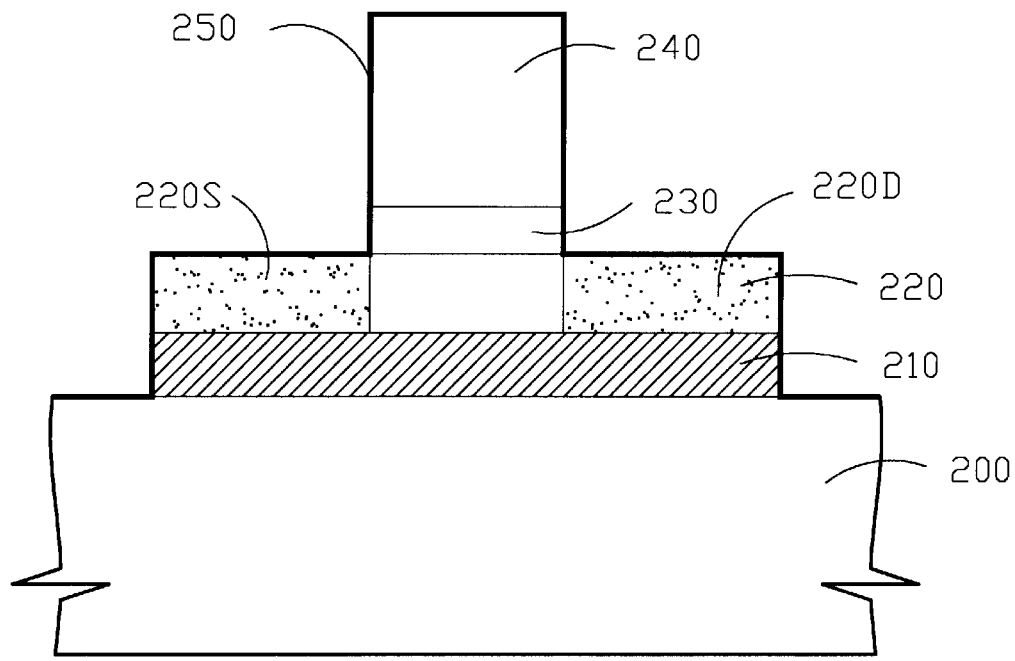

Referring to FIG. 2D, a nickel layer 250, having a thickness of 10 Å to 50 Å is formed by sputtering nickel on the formed structure. Here and other embodiments described below, nickel can be substituted with one of Pd, Ti, Ag, Au, Al, Sb, Cu, Co, Cr, Mo, Ir, Ru, Rh, Cd, Pt, etc.

Figure 2E:
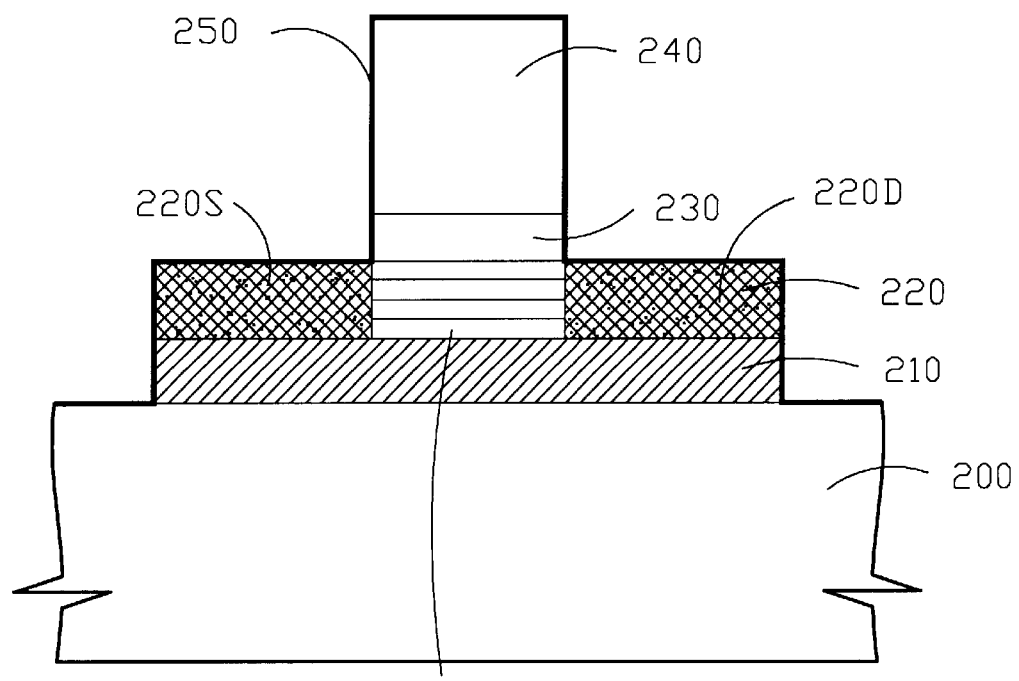

Referring to FIG. 2E, the formed structure is thermally heated in a furnace at a temperature of 350° C. to 600° C. wherein crystallization of amorphous silicon process. During the process of crystallizing amorphous silicon, portions of the active region 220 having the nickel layer 250 thereon are crystallized by MIC, while a channel region 220C is crystallized by MILC. Hence, the source region 220S and drain region 220D becomes a MIC region, a channel region 220C is an MILC region.

The insulating gettering layer by the present method provides advantages as the following:

1. The present invention is to provide a method to form an insulating gettering layer with impurity gettering absorbing the metal impurity of channel layer and reducing the concentration of the metal impurity of channel region.
2. The present invention is to provide a method to form an insulating gettering keeping the temperature low, the polycrystalline silicon grain big and to maintain to high carrier mobility in metal-induced-laterally-crystallization thin-film transistor.
3. The present invention is to provide a method to form an insulating gettering reducing leakage current to improve device performance and reliability.

Although specific embodiment have been illustrated and described, it will be obvious to those skilled in the art that various modifications may be made without departing from what is intended to be limited solely by the appended claims.

What is claimed is:

1. A thin-film transistor structure with reduced impurities, said structure comprising:

an insulating substrate;

an insulating gettering layer on said insulating substrate;

a source region, a drain region, and a metal induced laterally crystallization polysilicon channel region connecting said source region and said drain region on said insulating gettering layer;

a rate oxide layer on said channel region; and a gate electrode on said gate oxide layer.

2. The structure according to claim 1, wherein said insulating substrate comprises a glass substrate.

3. The structure according to claim 1, wherein said insulating gettering has impurity gettering function absorbing metal impurities within said channel region such that concentrations of metal impurity within said channel region is decreased.

4. The structure according to claim 3, wherein the thickness of said insulating gettering layer is between about 300 angstrom to about 1000 angstrom.

5. The structure according to claim 4, wherein said insulating gettering layer comprises a phosphosilicate glass (PSG) layer.

6. The structure according to claim 5, wherein said insulating gettering layer is deposited by a plasma enhanced chemical vapor deposition process.

7. A thin-film transistor structure with reduced impurities, said structure comprising:

an insulating substrate;

an insulating gettering layer on said insulating substrate, wherein said insulating gettering has impurity gettering function absorbing metal impurities;

a source region, a drain region, and a metal induced laterally crystallization polysilicon channel region connecting said source region and said drain region on said insulating gettering layer;

a gate oxide layer on said channel region; and a gate electrode on said gate oxide layer.

8. The structure according to claim 7, wherein said insulating substrate comprises a glass substrate.

9. The structure according to claim 7, wherein the thickness of said insulating gettering layer is between about 300 angstrom to about 1000 angstrom.

10. The structure according to claim 9, wherein said insulating gettering layer comprises a phosphosilicate glass layer.

11. The structure according to claim 10, wherein said insulating gettering layer is deposited by a plasma enhanced chemical vapor deposition process.

12. A thin-film transistor structure with reduced impurities, said structure comprising:
- an insulating substrate;
- an insulating gettering layer with a thickness from about 300 angstrom to about 1000 angstrom on said insulating substrate;
- a source region, a drain region, and a metal induced laterally crystallization polysilicon channel region connecting said source region and said drain region on said insulating gettering layer;
- a gate oxide layer on said channel region; and
- a gate electrode on said gate oxide layer.

13. The structure according to claim 12, wherein said insulating substrate comprises a glass substrate.

14. The structure according to claim 12, wherein said insulating gettering has impurity gettering function absorbing metal impurities within said channel region such that concentrations of metal impurity within said channel region is decreased.

15. The structure according to claim 14, wherein said insulating gettering layer comprises a phosphosilicate glass layer.

16. The structure according to claim 15, wherein said insulating gettering layer is deposited by a plasma enhanced chemical vapor deposition process.

* * * * *